United States Patent [19]

Machida et al.

[11] Patent Number: 5,674,771
[45] Date of Patent: Oct. 7, 1997

[54] CAPACITOR AND METHOD OF MANUFACTURING THE SAME

[75] Inventors: Katsuyuki Machida; Kazuo Imai; Hideo Yoshino; Yoshiharu Ozaki; Kenji Miura, all of Kanagawa, Japan

[73] Assignee: Nippon Telegraph and Telephone Corporation, Japan

[21] Appl. No.: 34,906

[22] Filed: Mar. 22, 1993

[30] Foreign Application Priority Data

| Apr. 20, 1992 | [JP] | Japan | 4-125507 |
| Apr. 20, 1992 | [JP] | Japan | 4-125508 |
| Apr. 20, 1992 | [JP] | Japan | 4-125509 |

[51] Int. Cl.[6] ............................................ H01L 21/70
[52] U.S. Cl. ............. 437/60; 437/238; 437/241; 437/228; 437/919
[58] Field of Search ............... 437/919, 228, 437/60, 238, 241

[56] References Cited

U.S. PATENT DOCUMENTS

| 4,419,385 | 12/1983 | Peters | 427/99 |
| 4,839,311 | 6/1989 | Riley et al. | 437/228 |
| 4,939,099 | 7/1990 | Seacrist et al. | 437/31 |
| 4,997,794 | 3/1991 | Josquin et al. | 437/228 |
| 5,006,363 | 4/1991 | Fujii et al. | 427/39 |
| 5,013,692 | 5/1991 | Ide et al. | 437/241 |
| 5,025,741 | 6/1991 | Suwanai et al. | 437/52 |
| 5,057,447 | 10/1991 | Paterson | 437/43 |
| 5,089,436 | 2/1992 | Hong et al. | 437/60 |
| 5,101,251 | 3/1992 | Wakamiya et al. | 357/23.6 |
| 5,108,941 | 4/1992 | Paterson et al. | 437/47 |
| 5,130,267 | 7/1992 | Kaya et al. | 437/47 |
| 5,286,667 | 2/1994 | Lin et al. | 437/52 |
| 5,312,783 | 5/1994 | Takasaki et al. | 437/235 |

FOREIGN PATENT DOCUMENTS

| 61-248458 | 11/1986 | Japan | H01L 27/04 |
| 63-58954 | 3/1988 | Japan | H01L 27/04 |
| 63-80538 | 4/1988 | Japan | H01L 21/31 |

OTHER PUBLICATIONS

Wolf, Stanley and Richard Tauber, 'Si Proc. for the VLSI ERA', vol. 1, pp. 529 and 530.

Katsuyuki Machida et al., "$SiO_2$ planarization technology with biasing and electron cyclotron resonance plasma deposition for submicron interconnections" J. Vac. Sci. Technol. B4(4), Jul./Aug. 1986, pp. 818–821.

*Primary Examiner*—Charles L. Bowers, Jr.
*Assistant Examiner*—Matthew Whipple
*Attorney, Agent, or Firm*—Blakely Sokoloff Taylor & Zafman

[57] ABSTRACT

A structure of a capacitor includes a first metal interconnection layer, a dielectric film, and a second metal interconnection layer. The dielectric film is formed on the first metal interconnection layer. The second metal interconnection layer is formed on the dielectric film. The dielectric film is a dielectric film formed by bias-ECR plasma CVD.

3 Claims, 11 Drawing Sheets

CAPACITOR AND METHOD OF MANUFACTURING THE SAME

BACKGROUND OF THE INVENTION

The present invention relates to a capacitor and a method of manufacturing the same.

In general, in a semiconductor integrated circuit device, active elements such as a MOSFET and a bipolar transistor and passive elements such as a resistor and a capacitor are used. In order to integrate these elements, various strict conditions are required for these elements. A capacitor is not an exception.

Practical conditions required for a capacitor are as follows.

(1) For a high integration density, a capacitor must have a small area and a large capacitance.

(2) For a high-speed operation, frequency dependence of a capacitor must be low. A capacitor of this type generally has a structure in which a dielectric film layer is sandwiched by electrodes. The thickness of the dielectric film layer must be decreased to satisfy condition (1), and the resistances of the electrodes must be decreased to satisfy condition (2).

Figure 1:
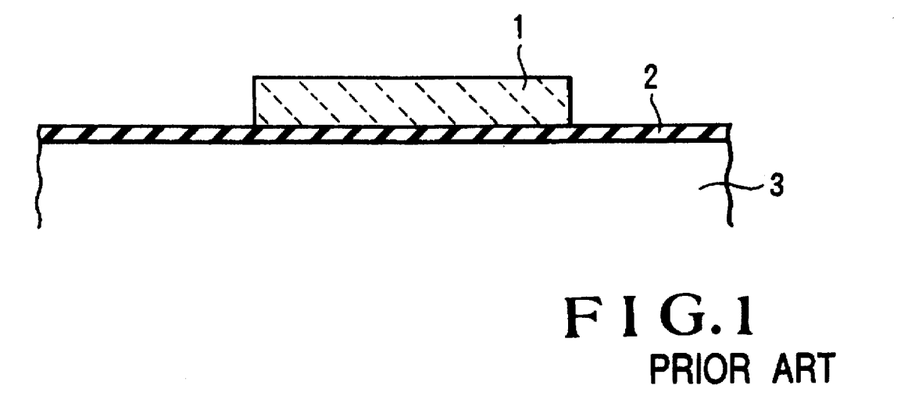
FIG. 1 is a sectional view showing the structure of a conventional capacitor.
Figure 2:
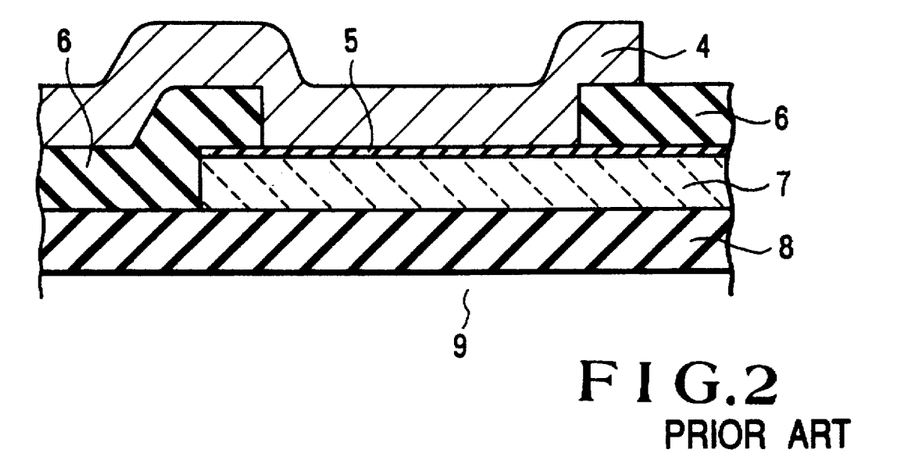
FIG. 2 is a sectional view showing the structure of another conventional capacitor.
Figure 3:
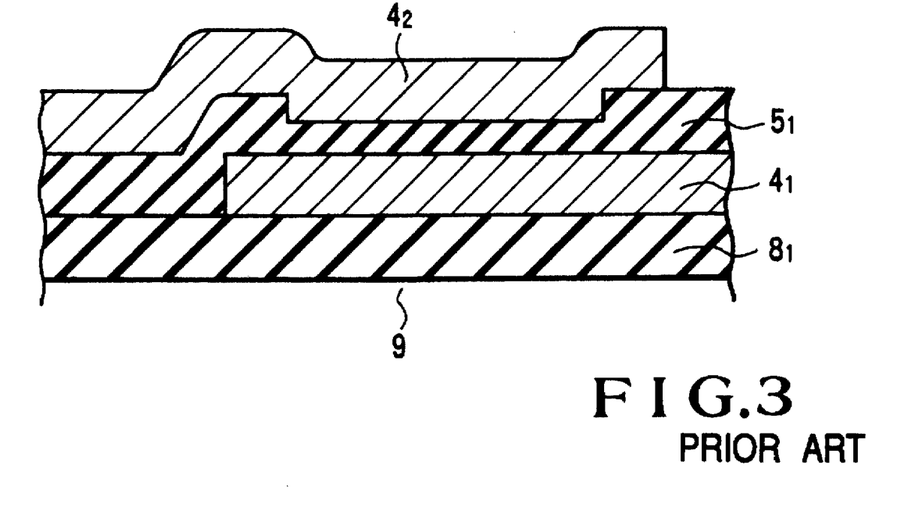
FIG. 3 is a sectional view showing the structure of still another conventional capacitor.
Figure 4:
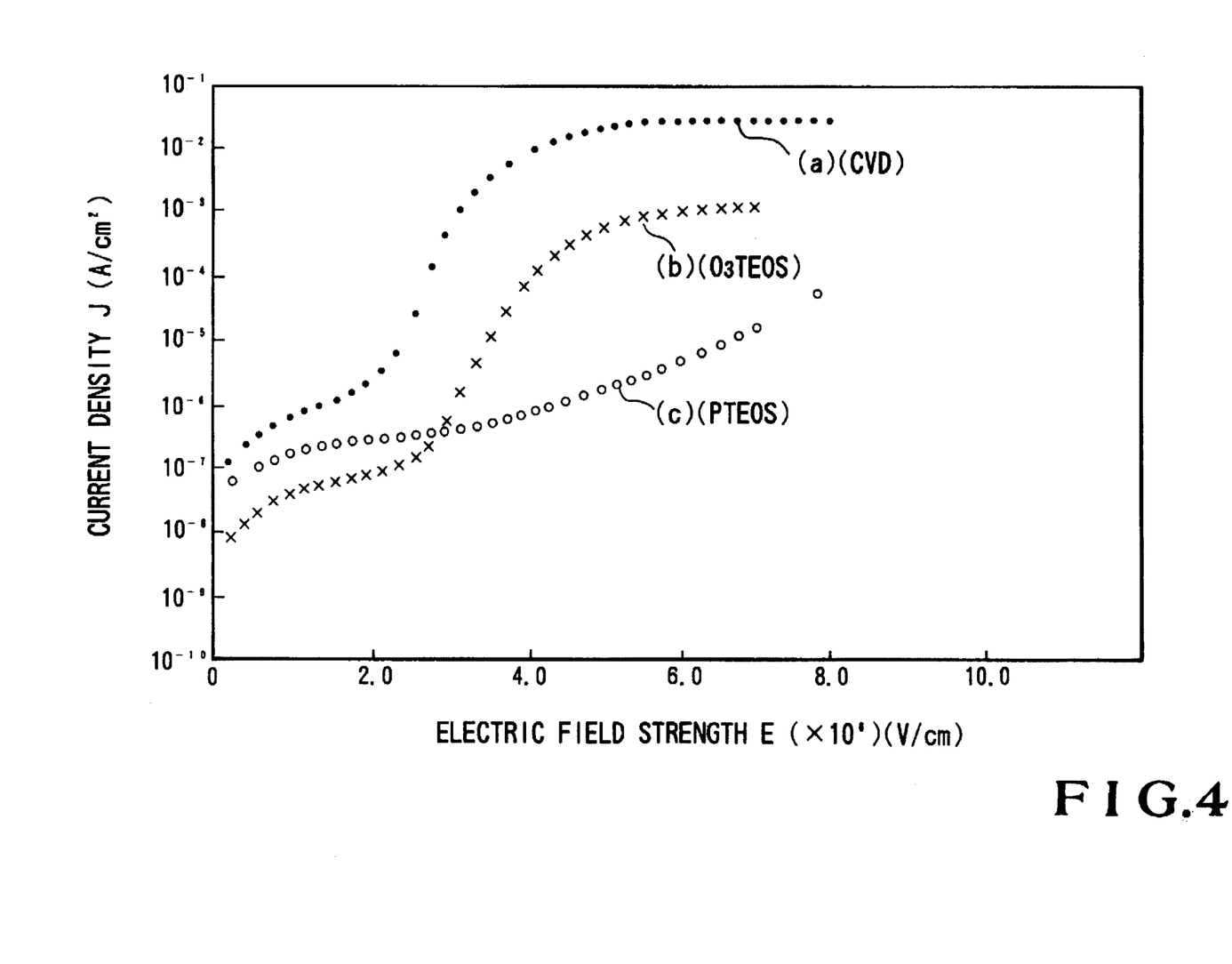
FIG. 4 is a graph showing the current density-electric field strength characteristics of dielectric films used in a capacitor.

However, a structure which satisfies conditions (1) and (2) has not yet been obtained. For example, structures shown in FIGS. 1 and 2 are proposed to satisfy condition (1). FIG. 1 shows a case wherein a thermal silicon dioxide is used as a dielectric film layer 2. In this case, the thickness of the dielectric film layer 2 can be decreased to about 10 nm to increase a capacitance per unit area. However, two electrodes are formed by monocrystalline silicon 3 and polysilicon 1, respectively, to make it difficult to decrease the resistances. In addition, in the capacitor shown in FIG. 2, a polysilicon oxide film is used as a dielectric film layer 5, a resistance is decreased by using a metal layer 4 as one electrode. However, the other electrode is formed of polysilicon 7 to disable a sufficiently high speed operation. In FIG. 2, reference numerals 6 and 8 denote dielectric films, and reference numeral 9 denotes a monocrystalline silicon substrate. In order to satisfy condition (2) for a high speed operation, a capacitor as shown in FIG. 3 in which metal interconnections $4_1$ and $5_1$ are electrodes having low resistivity. FIG. 3 shows a case wherein metal layers having low resistances and formed by using a multilevel metal interconnection technique for two or more layers are used as electrodes. In this case, although a dielectric film formed by normal plasma CVD or thermal CVD and used in a multilevel interconnection technique is used as the dielectric film layer $5_1$, this film has film characteristics inferior to those of a CVD oxide, and a current easily flows in the electric field of the dielectric film as shown in FIG. 4. The thickness of the dielectric film cannot be easily decreased in consideration of dielectrics characteristics, and the dielectric film having a large thickness must be used. For this reason, the capacitor has a small capacitance per unit area, and the capacitor is not suitable for a high integration density. In the CVD, the temperature for forming films is about 400° C. When the films are formed on an aluminum-alloy-based metal interconnection, deformation (migration) of aluminum occurs due to heat. As a result, the breakdown of the capacitor occurs, the yield is decreased, and reliability is degraded.

For these reasons, capacitors currently used are insufficient, and the arrangement of a higher-performance capacitor is required. In this case, the current-voltage characteristics of a dielectric film used for an interconnection process will be described below using FIG. 4. Characteristic curve (a) indicates a dielectric film formed by CVD, characteristic curve (b) indicates a dielectric film formed by ozone TEOS (tetraethoxysilane), and characteristic curve (c) indicates a dielectric film formed by plasma TEOS CVD to have a thickness of 500 Å. Each of all the dielectric films is formed at a substrate heat temperature of 400° C., and this temperature is a maximum temperature in a multilevel interconnection process of an aluminum-based film. Note that the current-voltage characteristics shown in FIG. 4 are obtained under the following conditions. That is, a reverse voltage is applied to MIS structures in which various dielectric films are formed on silicon substrates and metal electrodes are formed on these dielectric films. In the characteristics, a dielectric film having a large current value has poor dielectric characteristics.

As is apparent from the characteristics in FIG. 4, a desirable dielectric film has a large electric field intensity and a small current value. The current-voltage characteristics are characteristics on a silicon substrate, and characteristics on a metal are clearly degraded in consideration of the roughness of the surface of the metal. That is, when a dielectric film is used in a state-of-the-art interconnection process, the dielectric film having a small thickness cannot be formed on a metal, and a capacitor cannot be manufactured using the dielectric film.

SUMMARY OF THE INVENTION

It is an object of the present invention to provide a capacitor having a high speed operation and a high density and a method of manufacturing the same.

It is another object of the present invention to provide a capacitor which is more reliable than a conventional Capacitor and a method of manufacturing the same.

It is still another object of the present invention to provide a capacitor which can be obtained without any special consideration in circuit design and a method of manufacturing the same.

In order to achieve the above objects, according to an aspect of the present invention, there is provided a structure of a capacitor, comprising a first metal interconnection layer, a dielectric film formed on the first metal interconnection layer, and a second metal interconnection layer formed on the dielectric film, wherein the dielectric film is a dielectric film formed by bias-ECR plasma CVD.

According to another aspect of the present invention, there is provided a method of manufacturing a capacitor, comprising the steps of forming an interlevel dielectric on a first metal interconnection layer, removing an interlevel dielectric at a position where the capacitor is to be formed, forming a dielectric film for forming the capacitor by bias-ECR plasma CVD, forming a through-hole, and forming a second metal interconnection layer.

According to still another aspect of the present invention, there is provided a method according to claim 6, wherein the dielectric film for forming the capacitor is any one selected from a silicon nitride film, a silicon dioxide film, and an oxi-nitride-film which are formed by bias-ECR plasma CVD.

According to still another aspect of the present invention, there is provided a method of manufacturing a capacitor, comprising the steps of forming an interlevel dielectric on a first metal interconnection layer, removing a portion of the interlevel dielectric film in a tapered shape at a position where the capacitor is to be formed, forming a dielectric film for forming the capacitor by bias-ECR plasma CVD, forming a through-hole, and forming a second metal interconnection layer.

According to still another aspect of the present invention, there is provided a method of manufacturing a capacitor, in the step of forming a multilevel interlevel dielectric film consisting of a plurality of different films between first and second electrode interconnection layers, comprising the steps of forming, as a lowest layer of the multilevel interlevel dielectric film, a dielectric film having an etching selectivity higher than that of a layer immediately formed on the lowest layer, forming a dielectric film on the dielectric film, and then etching the multilevel interlevel dielectric film at a predetermined position on the first electrode interconnection layer except for the dielectric film on the lowest layer to form the second electrode interconnection layer.

More specifically, in order to realize a high-speed operation, electrodes are formed by a metal, and the thickness of the dielectric film can be decreased using as a dielectric film layer between the electrode metals a high-quality dielectric film formed by bias-ECR-plasma CVD at a low temperature. In addition, in order to improve reliability, a refractory metal or a refractory metal compound is formed on each of the interfaces between the metal electrodes and the dielectric film.

In a multilevel interconnection process, a high-quality dielectric film is formed on an electrode interconnection by bias-ECR plasma CVD to easily form a capacitor, and an increase in number of the steps is minimized. Therefore, according to the present invention, a capacitor can be provided without any special rules in circuit design.

DESCRIPTION OF THE PREFERRED EMBODIMENTS

A difference between the present invention and the prior arts will be described prior to a description of the embodiments of the present invention.

A capacitor characterized by the present invention includes a first metal interconnection layer, a dielectric film formed on the first metal interconnection layer, and a second metal interconnection layer formed on the dielectric film. The dielectric film is formed by bias-ECR plasma CVD. The structure described above has the following characteristic features. For example, an interlevel dielectric is formed after a first electrode interconnection is formed, and the interlevel dielectric is removed to form a capacitor at a desired position on the first electrode interconnection. In addition, a dielectric film for forming the capacitor is formed by bias-ECR plasma CVD, the step of forming a through-hole is performed, and a second electrode interconnection is formed. Therefore, according to the present invention, only when the step of forming an opening in a capacitor region and the step of forming the dielectric film are additionally performed after a normal interlevel dielectric film is formed, the capacitor can be easily formed. The dielectric film for forming the capacitor is formed to have a small thickness of 2,000 Å or less, problems in the processes are rarely posed, and a desired capacitor can be obtained. In this point, the present invention is considerably different from the prior arts.

The present invention also has the following characteristic features. The step of forming an interlevel dielectric film after a first electrode interconnection is formed, after a dielectric film for forming a capacitor is formed by bias-ECR plasma CVD, an interlevel dielectric film is formed, the step of removing the interlevel dielectric film by wet etching to form the capacitor at a desired position on the first electrode interconnection and the step of forming a through-hole are performed, and a second electrode interconnection is formed. Therefore, according to the present invention, a dielectric film for a capacitor is formed during formation of a normal interlevel dielectric film, and wet etching is used in the step of removing the interlevel dielectric film of a capacitor portion, thereby easily forming the capacitor portion. The dielectric film for forming the capacitor is formed to have a small thickness of 2,000 Å or less, problems in the processes are rarely posed, and a desired capacitor can be obtained. In this point, the present invention is considerably different from the prior arts.

Embodiments of the present invention will be described below in detail.

Embodiment 1

Figure 5:
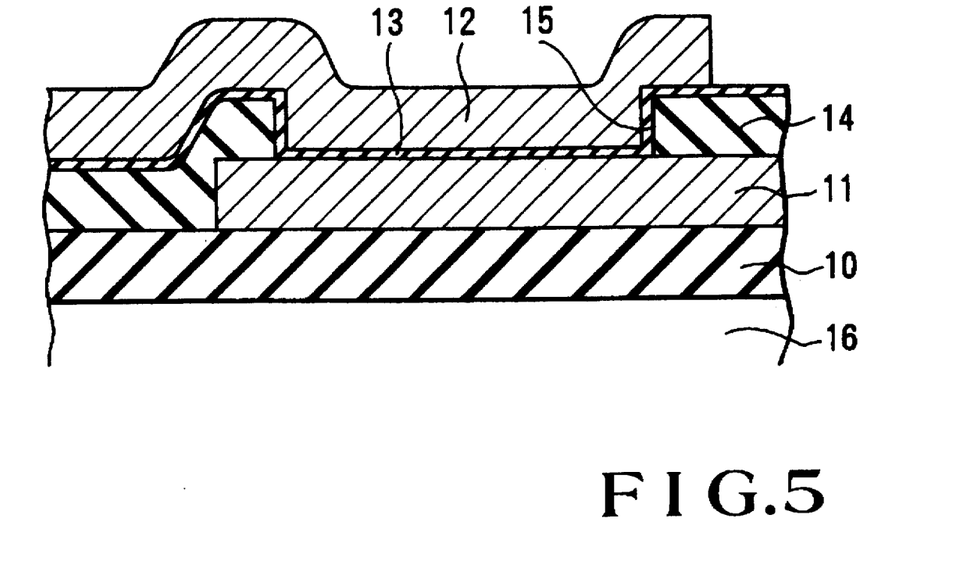
FIG. 5 is a sectional view showing a capacitor according to an embodiment of the present invention.
Figure 6:
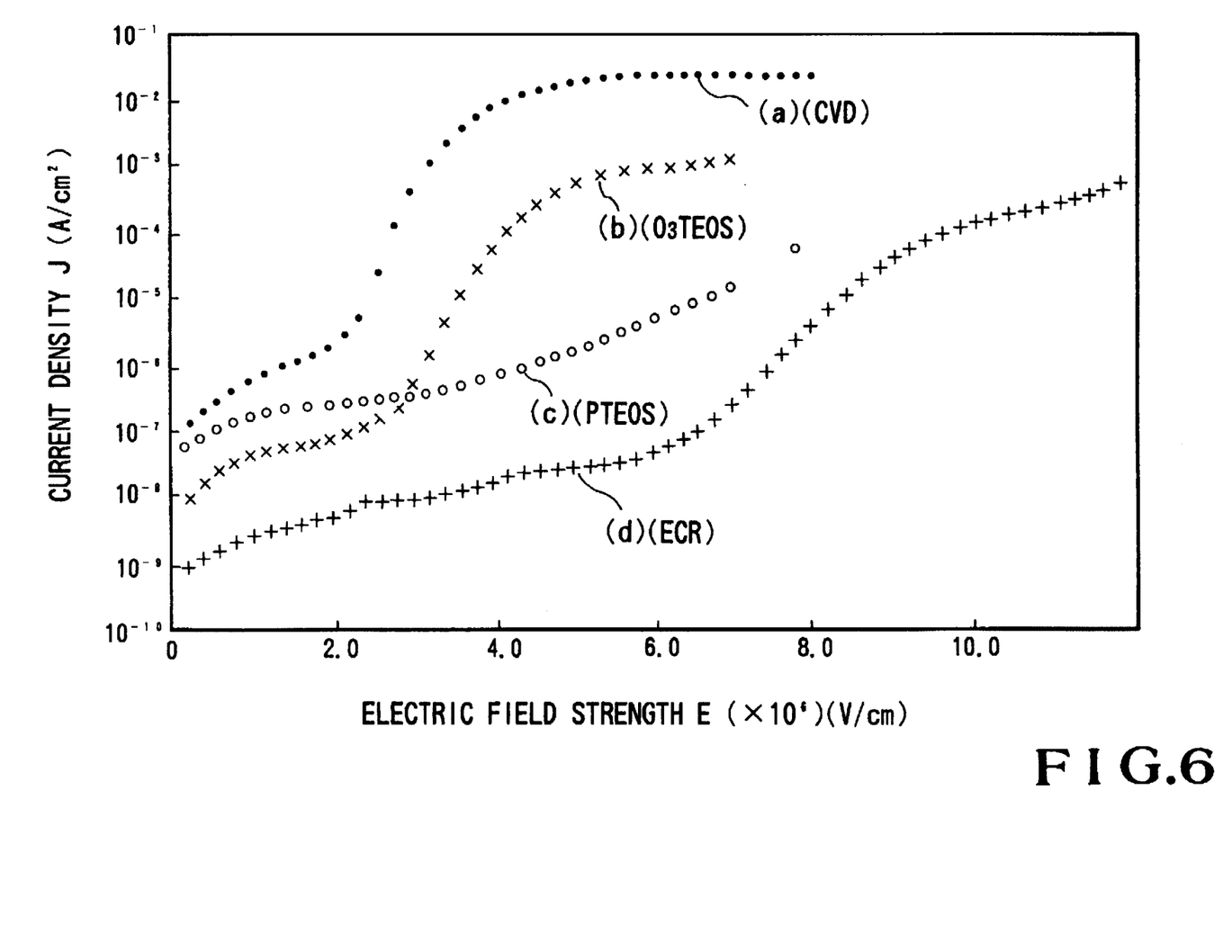
FIG. 6 is a graph showing the current density-electric field strength characteristics of a dielectric film used in the capacitor in FIG. 5.

FIG. 5 shows the first embodiment of the present invention. Referring to FIG. 5, reference numeral 10, denotes a dielectric film formed on a silicon substrate 16, and a first metal interconnection layer 11 is selectively formed on the dielectric film 10. Reference numeral 14 denotes an interlevel dielectric film formed on the dielectric film 10 and the first metal interconnection layer 11. A desired position of the interlevel dielectric film 14, i.e., a position at which a capacitor is to be formed, is removed by etching, and in this state, a dielectric film 13 constituted by a silicon dioxide or nitride film is formed by bias-ECR plasma CVD. A second metal interconnection layer 12 is formed on the dielectric film 13. As the material of the metal interconnection layers 11 and 12, an aluminum-alloy-based (e.g., an alloy of aluminum and small amounts of Cu and Si, or the like) material used in the steps in manufacturing a conventional LSI is used. A dielectric film can be formed at a low temperature of 200° C. or less and a low pressure of $10^{-5}$ to $10^{-3}$ torr by the bias-ECR plasma CVD used for forming the dielectric film 13, so that a high-quality oxide or nitride film having quality close to that of a thermal silicon dioxide can be obtained. FIG. 6 shows the current density-electric field strength characteristics of $SiO_2$ films. In FIG. 6, characteristic curve (a) indicates a dielectric film formed by CVD; characteristic curve (b), a dielectric film formed by ozone TEOS (tetraethoxysilane); characteristic curve (c), a dielectric film (thickness: 500 Å) formed by plasma TEOS CVD; and characteristic curve (d), a dielectric film by bias-ECR plasma CVD according to the present invention. As is apparent from the characteristics in FIG. 6, even when an electric field higher than that of a conventional oxide film formed by CVD is applied to the dielectric film according to the present invention, the dielectric film used in the present invention and indicated by characteristic curve (d) has a current density lower than that of the conventional oxide film. Therefore, according to the present invention, a dielectric film having excellent dielectric characteristics can be obtained. The dielectric film formed in the present invention is formed at a temperature of 200° C. or less, migration does not easily occur in an aluminum-based metal interconnection during formation of the dielectric film, and the breakdown of the capacitor according to the present invention tends not to occur.

Figure 7A:
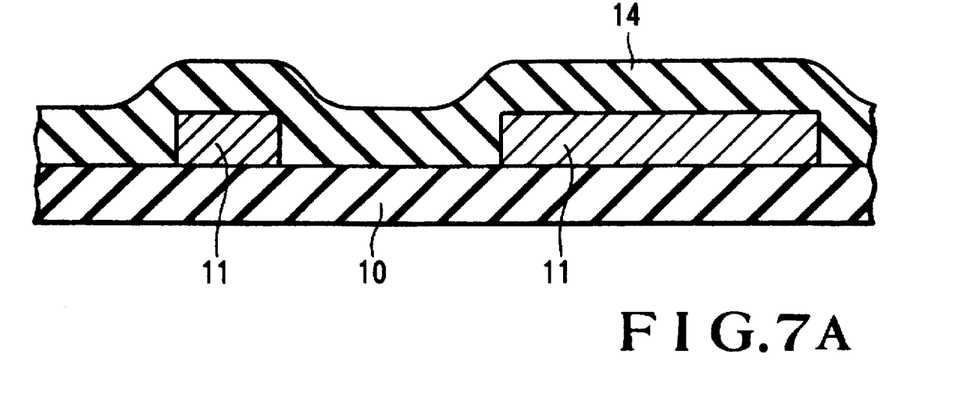
FIGS. 7A to 7C are sectional views showing the steps in manufacturing the capacitor in FIG. 5.
Figure 7B:
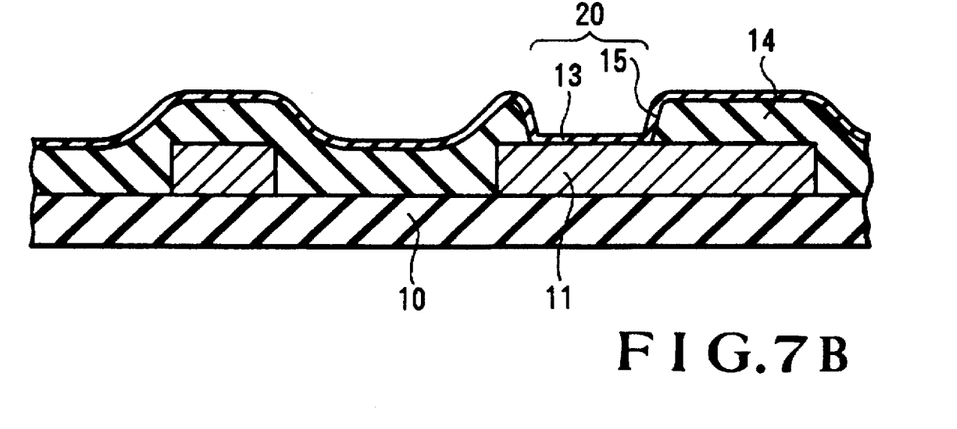
Figure 7C:
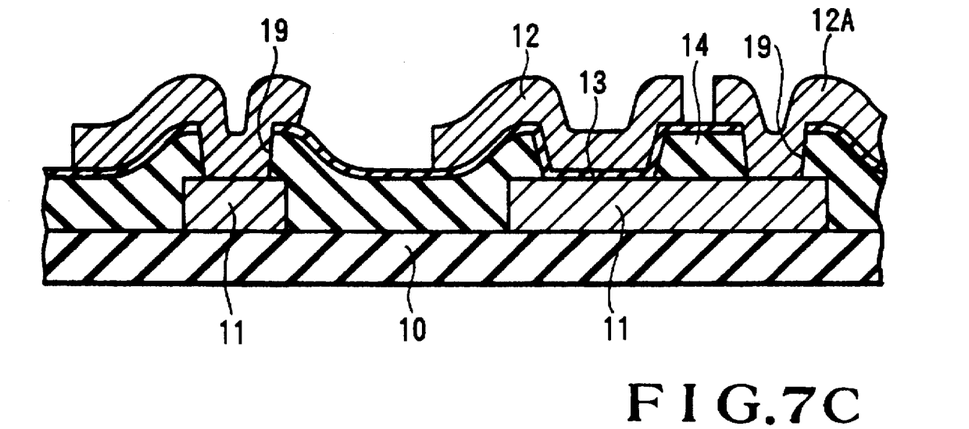

FIGS. 7A to 7C show a method of manufacturing a capacitor for realizing the structure in FIG. 5.

First, after the first metal interconnection layer 11 consisting of copper or aluminum in a predetermined pattern is formed on the dielectric film 10 formed by thermal oxidation or any other known method, the interlevel dielectric film 14 is formed by CVD (FIG. 7A).

A region of the interlevel dielectric film 14 in which a capacitor is to be formed is selectively removed to form an opening 15, and the dielectric film 13 consisting of $SiO_2$ film used for forming the capacitor is formed by bias-ECR plasma CVD (FIG. 7B). The bias-ECR plasma CVD used in this case is a method in which a plasma is produced by electron cyclotron resonance to form a thin film, an rf bias is applied to a substrate holder, and the improvement of thin film characteristics and the planarization of the thin film are performed by sputter-etching. A high-quality dielectric film can be formed at a temperature of below 200° C. and a low gas pressure of $10^{-5}$ to $10^{-3}$ torr. In this embodiment, $SiO_2$ film is formed under the following conditions. Here, a microwave power is 700 W, an rf power is 200 W, and $SiH_4$ and $O_2$ are used at a gas pressure of 1.0 mTorr. The rf power is applied for planarization, but the rf power may not be necessarily required. Note that reference numeral 20 denotes a capacitor portion.

A through-hole 19 for connecting the first metal interconnection layer 11 to a second interconnection layer 12A is formed at a predetermined position, and the second metal interconnection layers 12 and 12A are formed (FIG. 7C). In this manner, the structure described in the first embodiment of the present invention shown in FIG. 5 can be obtained.

Embodiment 2

Figure 8:
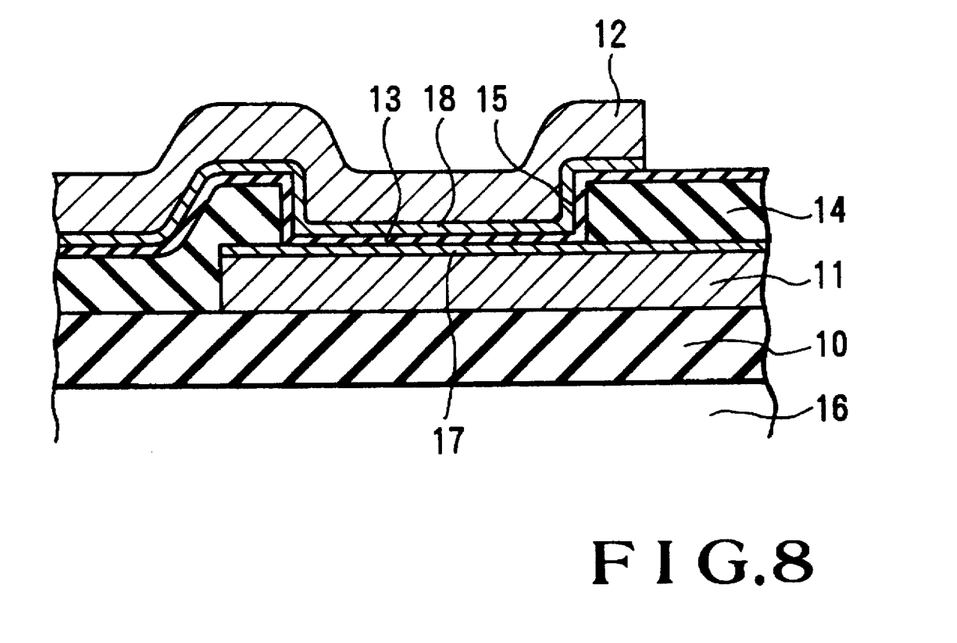
FIG. 8 is a sectional view showing the structure of a capacitor according to another embodiment of the present invention.

FIG. 8 shows the second embodiment of the present invention. The same reference numerals as in FIGS. 5 denote the same parts in FIG. 8. Referring to FIG. 8, unlike FIG. 5, refractory metal compound layers 17 and 18 are formed between a first metal interconnection layer 11 and a dielectric film 13 and between a second metal interconnection layer 12 and the dielectric film 13, respectively. The refractory metal compound layers used in this case contain a refractory metal such as titanium or tungsten, or a refractory metal compound such as titanium nitrite, and have characteristics in which migration caused by heat does not easily occur compared with an aluminum alloy. When these characteristics are combined with characteristics in which a dielectric film can be formed at a low temperature of bias-ECR plasma CVD, a higher-performance capacitor can be formed. All the metal interconnection layers can consist of a refractory metal as a matter of course.

The refractory metal compound layer used in this embodiment may be formed between the dielectric film 13 and at least one of the first interconnection layer 11 and the second interconnection layer 12 as a matter of course.

Figure 9A:
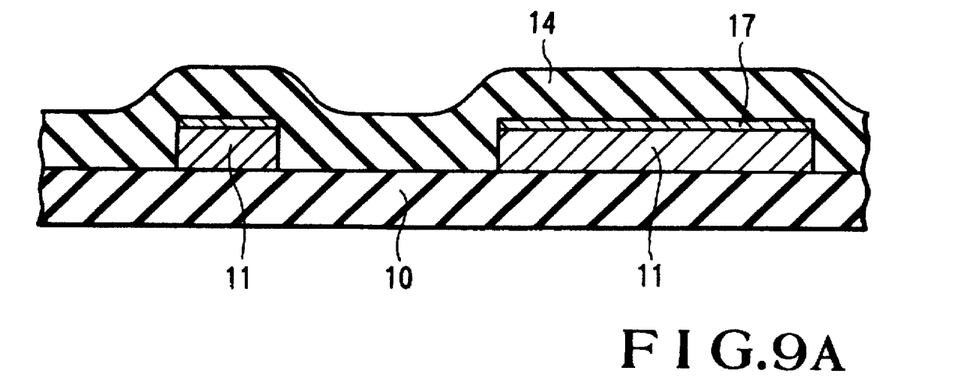
FIGS. 9A to 9C are sectional views showing the steps in manufacturing the capacitor in FIG. 8.
Figure 9B:
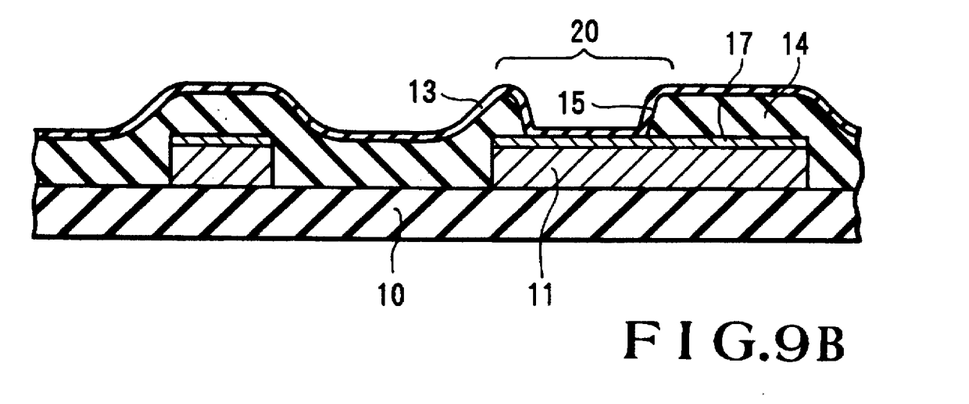
Figure 9C:
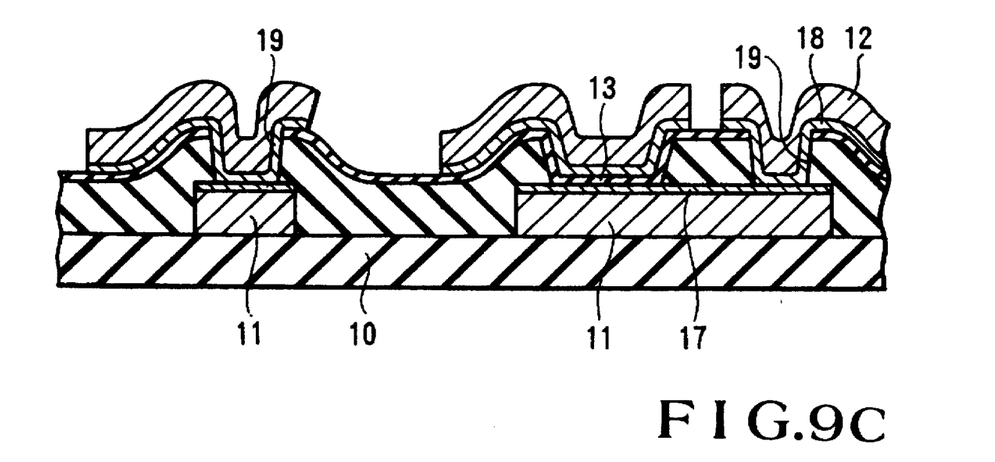

FIGS. 9A to 9C show a method of manufacturing a capacitor for realizing the structure of the second embodiment shown in FIG. 8. This manufacturing method is different from the method shown in FIG. 7A to 7C by the following points. The step of forming the refractory metal layer 17 consisting of a refractory metal or a refractory metal compound on at least the upper portion of the first metal interconnection layer 11 is additionally performed, and after the dielectric film 13 is formed, the step of forming the refractory metal layer 18 consisting of a refractory metal or a refractory metal compound on a portion on which a capacitor is to be formed and the second metal interconnection layer 12 is to be mounted is additionally performed. In the manufacturing method of the second embodiment, titanium, tungsten, molybdenum, or the like can be used as the refractory metal, and the refractory metal's nitride, oxide, or the like can be used as the compound.

Embodiment 3

Figure 10A:
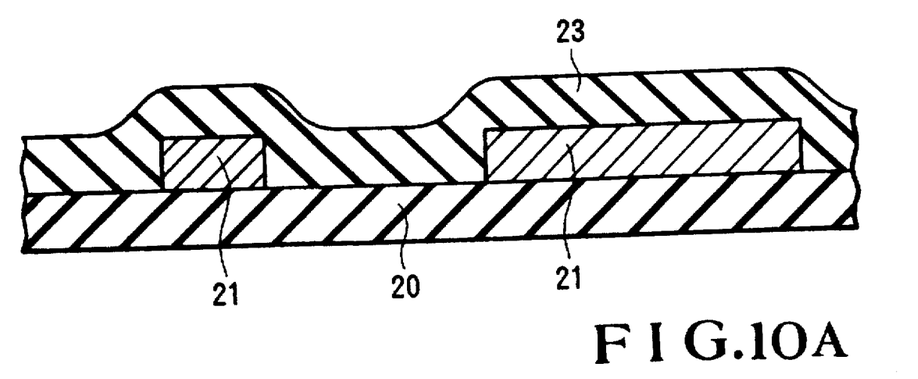
FIGS. 10A to 10C are sectional views showing the steps in manufacturing a capacitor according to still another embodiment of the present invention.
Figure 10B:
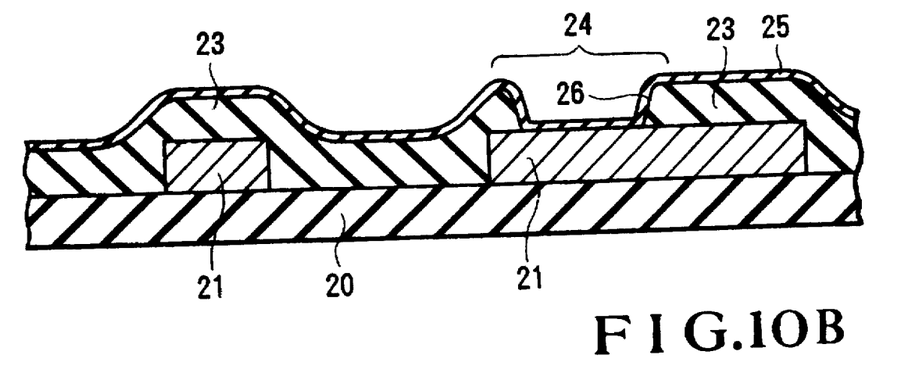
Figure 10C:
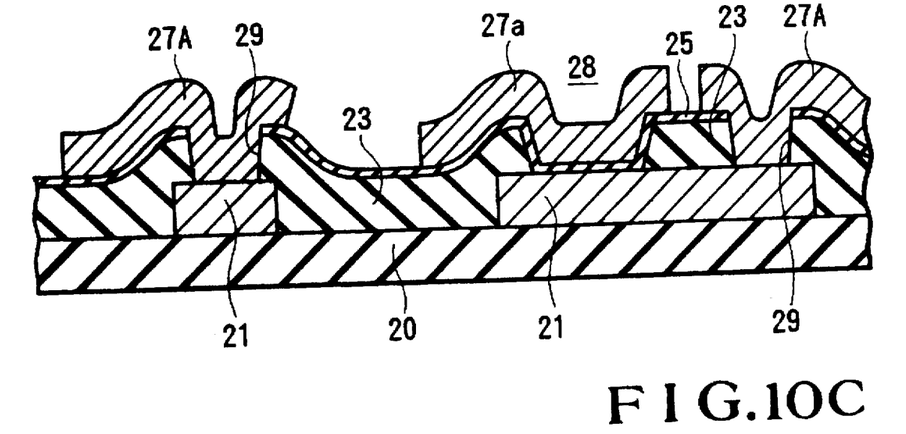

FIGS. 10A to 10C show the third embodiment of the present invention. Although a capacitor manufactured in this embodiment has the same structure as that of the capacitor manufactured in the first embodiment shown in FIG. 5, these capacitors are manufactured by different methods, respectively.

In FIGS. 10A to 10C, a first metal interconnection layer 21 consisting of Al(SiCu) is formed by sputtering in a predetermined pattern on a dielectric film 20 formed by thermal oxidation or any other known method to have a thickness of 5,000 Å, and an interlevel dielectric film 23 is formed by CVD to have a thickness of 5,000 Å (FIG. 10A). In FIG. 10B, reference numeral 24 denotes a region for a capacitor.

The region 24 in which a capacitor is to be formed is patterned and selectively dry-etched. This dry etching is performed to expose the surface of the first metal interconnection layer 21 consisting of Al(SiCu). An $SiO_2$ thin film 25 having a thickness of 2,000 Å or less is formed by bias-ECR plasma CVD (FIG. 10B). The $SiO_2$ film for a capacitor has any film thickness which can be obtained from the point of view of an interconnection process or reliability and a yield. In general, when the $SiO_2$ film has a small thickness, a capacitance per capacitor area is large. When the film has a small thickness, the yield or reliability may be degraded. When the thickness has a large thickness, a through-hole (to be described later) may be defectively formed. In this embodiment, a maximum thickness is set to be 2,000 Å. In this embodiment, the SiO$_2$ is formed under the following conditions. Here, a microwave power is 700 W, an rf power is 200 W, SiH$_4$ and O$_2$ are used, and a gas pressure is 1.0 mTorr. In this embodiment, an rf power is applied, even though a high-quality SiO$_2$ film can be obtained without the rf power. Thus, the application-of the rf power is dependent on process conditions.

A through-hole 29 for connecting the first interconnection layer 21 and a second interconnection layer 27A is formed at a predetermined position. Al(SiCu) is deposited by sputtering to have a thickness of 5,000 Å. This Al(SiCu) is processed to form the second interconnection layer 27A and a second interconnection layer 27a (FIG. 10C).

Figure 11:
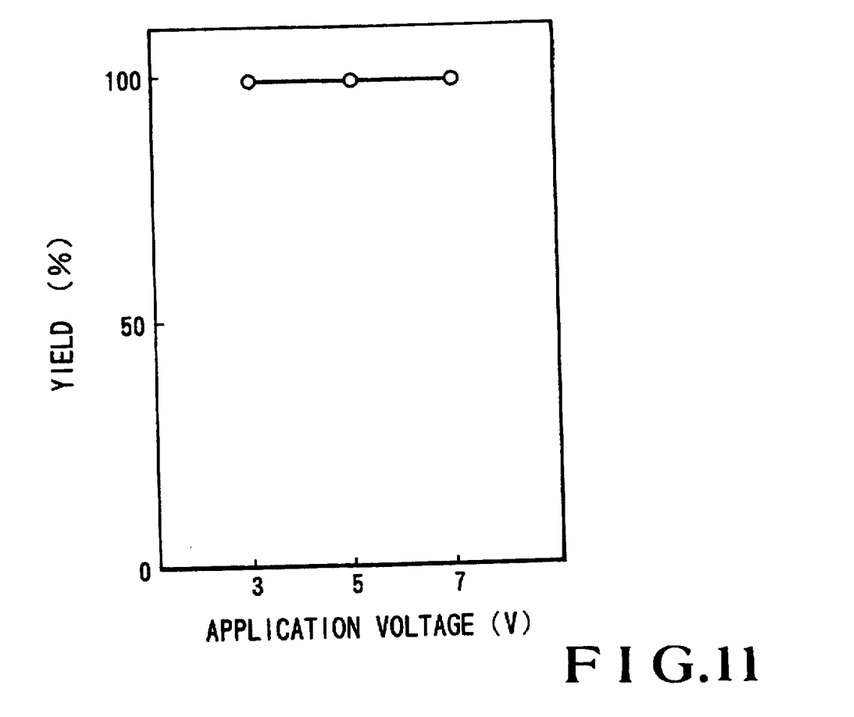
FIG. 11 is a graph showing the yield-application voltage characteristics of the capacitor in FIGS. 10A to 10C.
Figure 12:
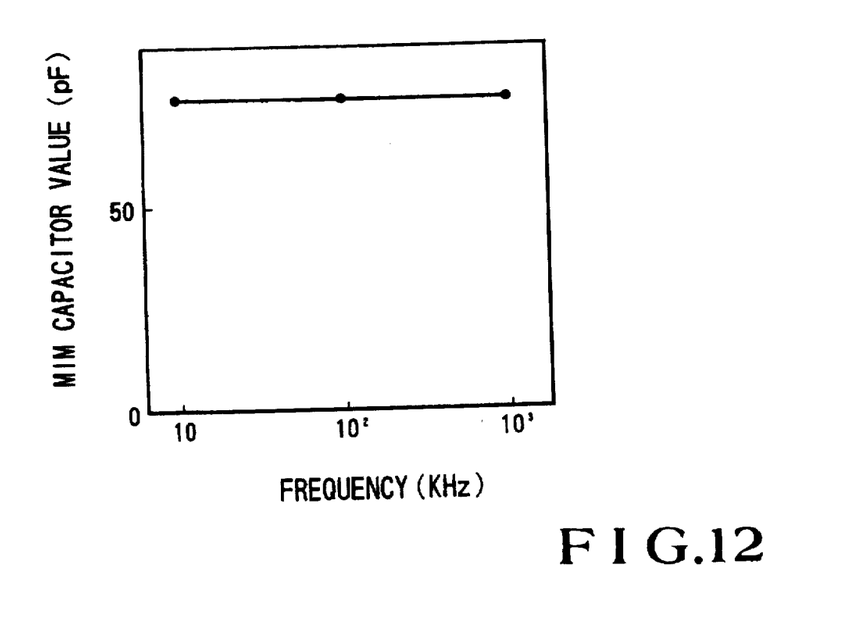
FIG. 12 is a graph showing the MIM (Metal Insulator Metal)-frequency characteristics of the capacitor in FIGS. 10A to 10B.

The characteristics of a capacitor element 28 manufactured in this embodiment will be described below. When the SiO$_2$ film 25 has a thickness of 1,100 Å, a capacitor having an average capacitance of 83 pF with respect to a set capacitance of 85 pF and variations of ±5.0% or less on a single wafer and between different wafers can be obtained. Leakage current characteristics in this case are shown in FIG. 11. In FIG. 11, the applied voltage is plotted along the abscissa, and the yield is plotted along the ordinate. As is apparent from the characteristics, a voltage of 7 V is applied, the yield of 100% can be obtained. In addition, FIG. 12 shows frequency dependence. In FIG. 12, a frequency is plotted along the abscissa, and an MIM (Metal Insulator Metal) capacitance value is plotted along the ordinate. As is apparent from FIG. 12, excellent characteristics in which a capacitance is not unaffected by change in frequency can be obtained. The characteristics cannot be obtained by the conventional capacitors using polysilicon shown in FIGS. 1 to 3. The thickness of the dielectric film 25 consisting of SiO$_2$ on a metal serving as an electrode is 1,100 Å, so that the step of forming a through-hole can be performed without any defect. A capacitor area can be decreased by decreasing the thickness of the dielectric film 25 as a matter of course. That is, it is understood that the following characteristic features can be obtained in the present invention. A capacitor formed by bias-ECR plasma CVD can be manufactured more easily than one made in any conventional manner, and an excellent capacitor can be obtained.

Embodiment 4

Figure 13A:
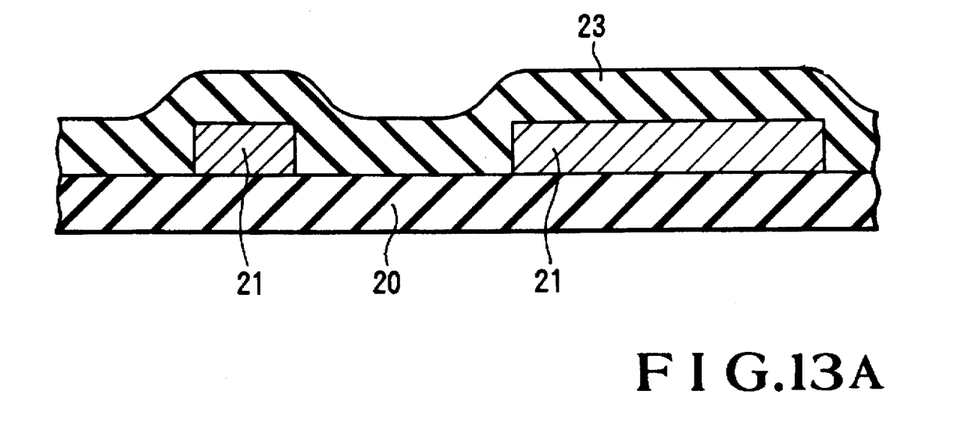
FIGS. 13A to 13C are sectional views showing the steps in manufacturing a capacitor according to still another embodiment of the present invention.
Figure 13B:
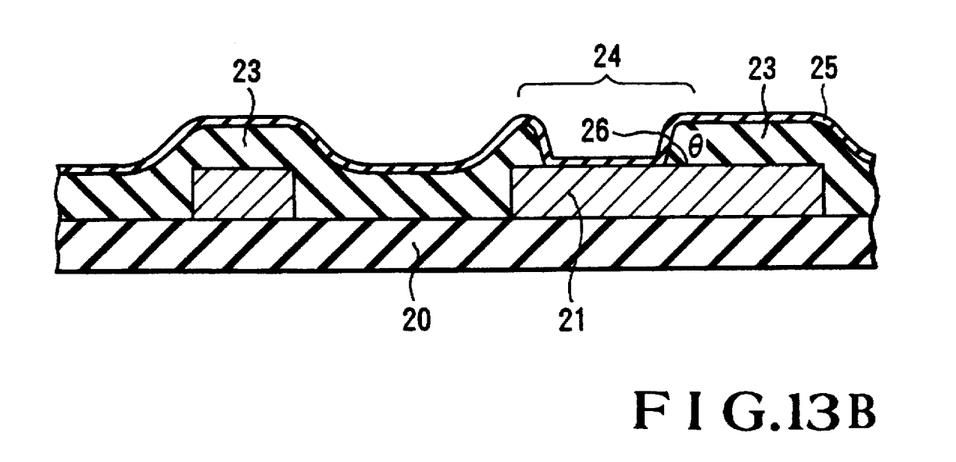
Figure 13C:
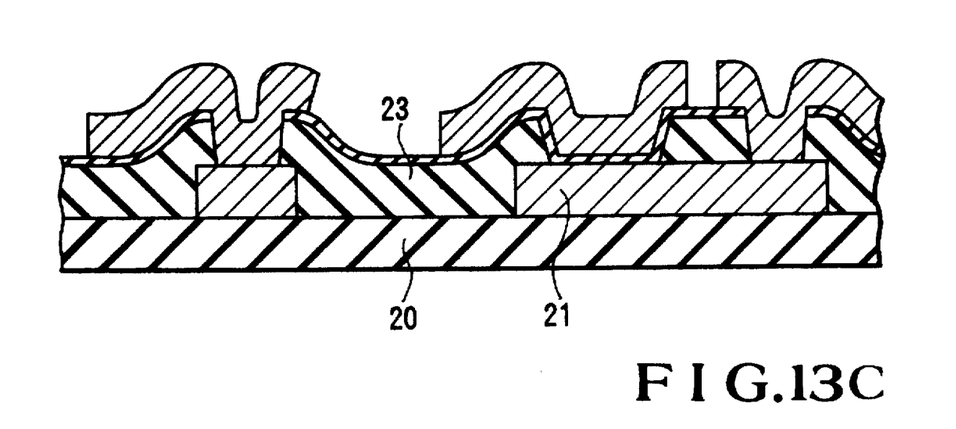

FIGS. 13A to 13C show the fourth embodiment of the present invention. In this embodiment, the steps shown in FIGS. 13A, 13B, and 13C are almost the same as those of FIGS. 10A to 10C, and a description thereof is omitted. The characteristics in this embodiment are as follows. When a dielectric film 25 is to be formed by bias-ECR plasma CVD, a side wall having the step height of an opening 26 has a thickness smaller than that of the dielectric film 25 in a flat portion, and the side wall having the step height has thin film characteristics poorer than those of the dielectric film 25 in the flat portion. In this embodiment, the portion having the step height has an inclination angle θ (taper angle) of 75° or less. In this manner, it is understood that thin film characteristics can be improved.

In this embodiment, taper-etching is performed at the opening 26 of the capacitor portion to obtain a taper angle of 60°. This taper angle θ can be adjusted by changing the content of O$_2$, i.e., a ratio of a CHF$_3$ pressure to an O$_2$ pressure, when a gas mixture of CHF$_3$ and O$_2$ is used.

Figure 14:
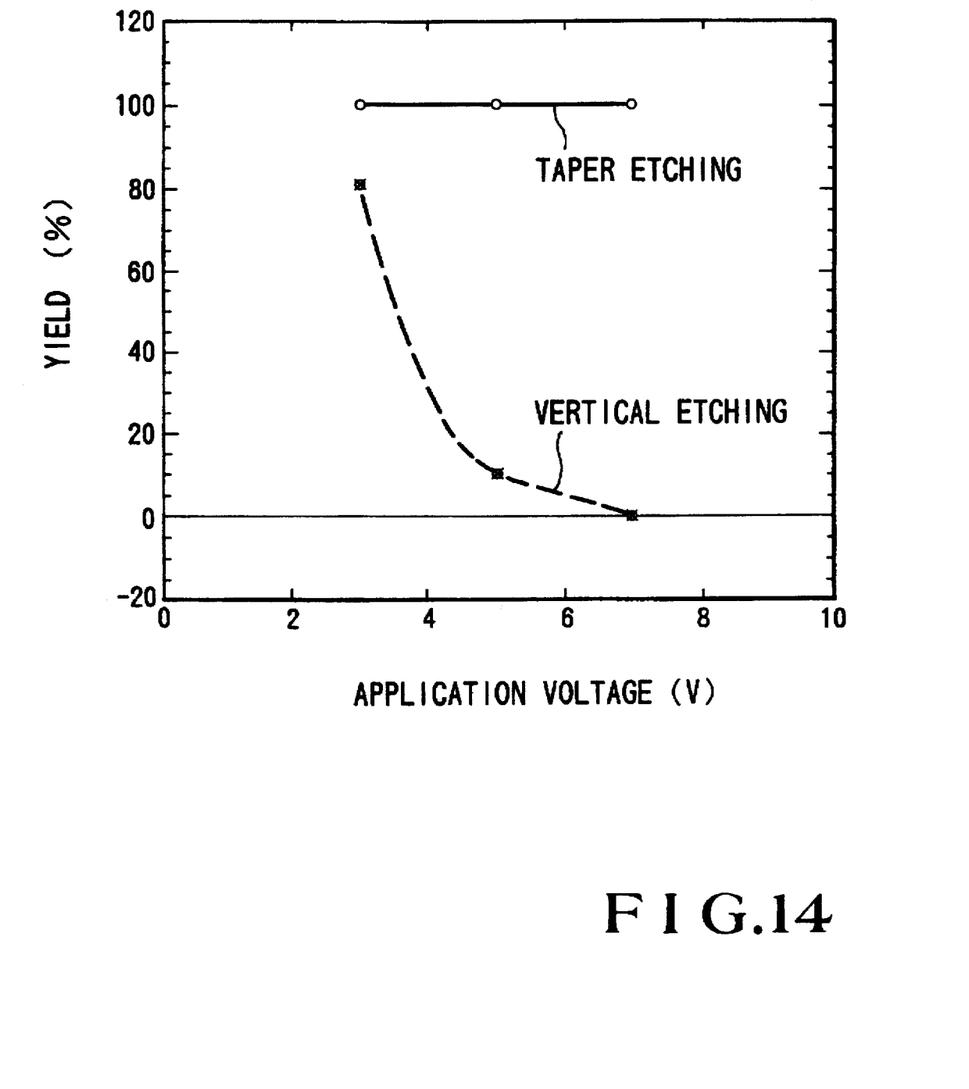
FIG. 14 is a graph showing the yield-application voltage characteristics of the capacitor in FIGS. 13A to 13C.

FIG. 14 shows the yield characteristics of a capacitor obtained as follows. That is, the steps in FIGS. 13A to 13C are used, i.e., a through-hole portion is patterned, an SiO$_2$ film is removed by dry-etching, an Al(SiCu) film is deposited by sputtering to have a thickness of 5,000 Å, and the Al(SiCu) film is processed. In FIG. 14, an applied voltage is plotted along the abscissa, and a yield is plotted along the ordinate. In FIG. 14, the thickness of the SiO$_2$ film 25 is 1,500 Å, and a capacitor in which a taper etching process is performed is compared with a capacitor in which a vertical etching process is performed. When the taper etching process is used, even when a voltage of 7 V is applied, the yield of 100% can be obtained. However, when the vertical etching process is used, it is understood that the yield is decreased in accordance with an increase in applied voltage. That is, when the taper process is performed to the capacitor portion, the thin film characteristics of the ECR-SiO$_2$ film 25 on the side wall having the step height are improved, a breakdown voltage is increased, and at the same time, the yield is increased. The present invention has the following characteristics. That is, in a capacitor manufactured by bias-ECR plasma CVD, degradation of a portion having a step height is eliminated by a taper process, and an excellent capacitor can be obtained.

Embodiment 5

Figure 15A:
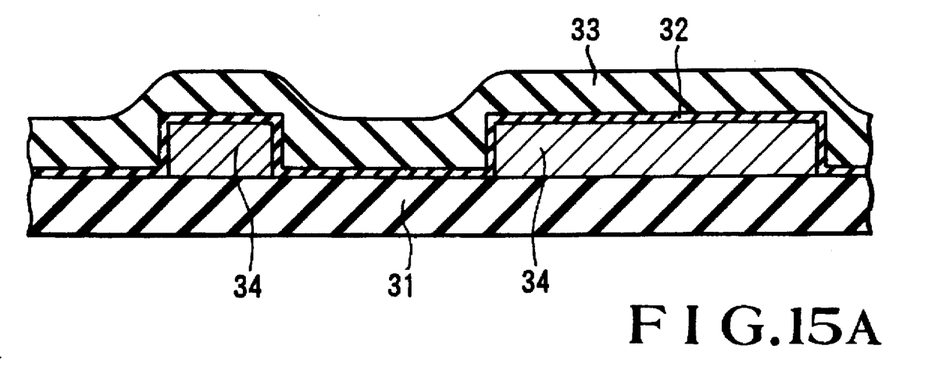
FIGS. 15A to 15C are sectional views showing the steps in manufacturing a capacitor according to still another embodiment of the present invention.
Figure 15B:
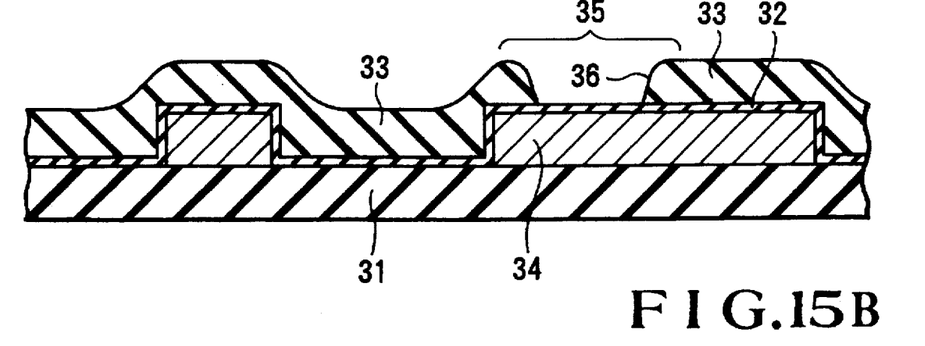
Figure 15C:
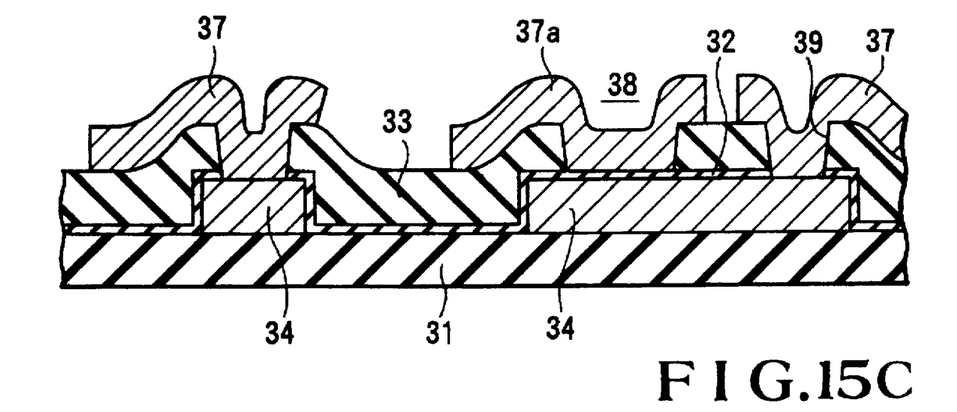

FIGS. 15A to 15C show the fifth embodiment of the present invention. In FIGS. 15A and 15B, reference numerals 31 and 33 denote interlevel dielectric film; 32, a dielectric film for a capacitor; and 34, an electrode interconnection. In this embodiment, the interlevel dielectric film 31 is formed by CVD to have a thickness of 5,000 Å, and the interlevel dielectric film 33 is formed by CVD to have a thickness of 3,000 Å. In addition, as the electrode interconnection 34, Al(SiCu) is deposited by sputtering to have a thickness of 5,000 Å and processed. As the dielectric film 32 for a capacitor, a nitride film is deposited by bias-ECR plasma CVD to have a thickness of 2,000 Å or less. An SiN film for a capacitor has any film thickness which can be obtained from the point of view of an interconnection process or reliability and a yield. In general, when the SiN film has a small thickness, a capacitance per capacitor area is large. However, the thin film thickness degrades the yield or reliability. On the other hand, when the thickness has a large thickness, the next step of forming a through-hole may be defectively performed. In this embodiment, a maximum thickness is set to be 2,000 Å. In this embodiment, the SiN film is formed under the following conditions. That is, a microwave power is 600 W, an rf power is 200 W, SiH$_4$ and N$_2$ are used, and a gas pressure is 1.0 mTorr. Under these conditions, an rf power is applied, while an SiN film having excellent film characteristics can be obtained without the rf power. Thus, the application of the rf power is dependent on process conditions. In FIG. 15B, reference numeral 35 denotes a capacitor region. In this embodiment, the capacitor portion is patterned, and the interlevel dielectric film is etched by wet-etching using an HF-based solution to expose the surface of the Al(SiCu). At this time, as shown in Table 1, SiN has a very low etching rate for the HF-based solution. Therefore, the interlevel dielectric film is rarely etched.

TABLE 1

| | Etching Rate by BHF |
|---|---|
| Thermal-SiO$_2$ | 600 Å/min |
| ECR—SiO$_2$ | 800 Å/min |
| ECR—SiN | 30 Å/min |

As the characteristics of the present invention, the formation of a veil (polymer film) which is formed on the side wall of the interlayer dielectric film during dry-etching can be prevented. The formation of the veil causes an insulation defect of a capacitor, and it is important in the reliability of the capacitor. In FIG. 15C, reference numerals 37 and 37a denote an electrode interconnection. FIG. 15C shows a state wherein the electrode interconnection 37 is formed after the step of forming a through-hole 39 is performed, and a multilevel interconnection and a capacitor are obtained. In this embodiment, the capacitor is obtained as follows. That is, a through-hole 39 portion is patterned, the $SiO_2$ film is removed by dry-etching, an Al(SiCu) film is deposited by sputtering to have a thickness of 5,000 Å, and the Al(SiCu) film is processed. Since the thickness of the nitride film 32 is small, the step of forming a through-hole 39 can be performed without any defect. In addition, the nitride film 32 can have a small thickness, and a capacitor area cab be decreased as a matter of course. That is, the present invention can have the following characteristics. A capacitor can be manufactured by bias-ECR plasma CVD easier than conventional capacitors, and an excellent capacitor can be obtained.

As has been described above, the present invention has the following advantages.

(1) When a capacitor has a structure in which a dielectric film formed by bias-ECR plasma CVD is used as a dielectric layer, since a film having quality higher-than that of a dielectric film formed by conventional CVD, a thin film can be obtained. For this reason, a capacitance per unit area can be increased, and the miniaturization of a capacitor, i.e., a high density, can be achieved. In addition, since the bias-ECR plasma CVD can be performed at a low temperature of 200° C. or less, migration of a metal interconnection can be suppressed, and the yield of capacitors can be increased, thereby improving the reliability of the capacitor.

(2) In this embodiment, metal interconnections are used as all the electrodes of a capacitor, so that the capacitor can have a low resistivity and the capacitor can be operated at high speed.

(3) In addition, a portion of a metal interconnection which is in contact with the dielectric film consists of a refractory metal or a refractory metal compound, to further suppress the migration of the metal interconnection, and a high reliability capacitor can be obtained.

According to the above characteristic features, the capacitor according to the present invention can have a high speed operation, a high density, and high reliability.

(4) In the present invention, in addition to the use of a dielectric film formed by bias-ECR plasma CVD, only the step of forming an opening at a capacitor region and the step of depositing a dielectric film for a capacitor are added to a multilevel interconnection process. These steps are very easily performed, so that a capacitor according to the present invention can be stably manufactured.

(5) In the present invention, a dielectric film formed by bias-ECR plasma CVD is used as the dielectric film of a capacitor, and the step of forming a tapered opening in a capacitor portion and the step of depositing a dielectric film for a capacitor are added to the multilevel interconnection process. These steps are very easily performed, so that a capacitor according to the present invention can be stably manufactured.

What is claimed is:

1. A method of manufacturing a capacitor, comprising the steps of:

forming an interlevel dielectric film on a first metal interconnection layer;

removing said interlevel dielectric film at a position where said capacitor is to be formed;

forming a dielectric film for forming said capacitor by bias-ECR plasma CVD;

forming a through-hole; and forming a second metal interconnection layer.

2. A method according to claim 1, wherein said dielectric film for forming said capacitor is any one selected from the group consisting of $SiO_2$ film, a silicon nitride film, and an oxi-nitride-film which are formed by bias-ECR plasma CVD.

3. A method of manufacturing a capacitor, comprising the steps of:

forming an interlevel dielectric film on a first metal interconnection layer;

removing said interlevel dielectric film in a tapered shape at a position where said capacitor is to be formed;

forming a dielectric film for forming said capacitor by bias-ECR plasma CVD;

forming a through-hole; and forming a second metal interconnection layer.

* * * * *

UNITED STATES PATENT AND TRADEMARK OFFICE
CERTIFICATE OF CORRECTION

PATENT NO. : 5,674,771
DATED : October 7, 1997
INVENTOR(S) : Machida et al.

It is certified that error appears in the above-identified patent and that said Letters Patent is hereby corrected as shown below:

In column 2, at line 6 please delete "400°C.," and insert --400°C,--.

In column 2, at line 32, please delete "Capacitor" and insert --capacitor--.

In column 9, at line 15, please delete "area cab" and insert --area can--.

Signed and Sealed this

Twenty-fifth Day of May, 1999

Attest:

*Attesting Officer*

Q. TODD DICKINSON

*Acting Commissioner of Patents and Trademarks*